(12) United States Patent
Hwang et al.

(10) Patent No.: US 6,406,795 B1
(45) Date of Patent: Jun. 18, 2002

(54) COMPLIANT UNIVERSAL SUBSTRATES FOR OPTOELECTRONIC AND ELECTRONIC DEVICES

(75) Inventors: Wen-Yen Hwang, Sugar Land, TX (US); Yucai Zhou; Zuhua Zhu, both of Ithaca, NY (US); Yu-Hwa Lo, San Diego, CA (US)

(73) Assignee: Applied Optoelectronics, Inc., Sugar Land, TX (US)

( * ) Notice: Subject to any disclaimer, the term of this patent is extended or adjusted under 35 U.S.C. 154(b) by 0 days.

(21) Appl. No.: 09/426,273

(22) Filed: Oct. 25, 1999

Related U.S. Application Data
(60) Provisional application No. 60/110,009, filed on Nov. 25, 1998.

(51) Int. Cl.$^7$ .................. B32B 15/04; H01L 29/12
(52) U.S. Cl. .............. 428/457; 428/620; 428/700; 257/9; 257/183
(58) Field of Search .................. 428/615, 620, 428/641, 642, 457, 689, 700

(56) References Cited

U.S. PATENT DOCUMENTS
5,294,808 A    3/1994  Lo
5,981,400 A   11/1999  Lo

OTHER PUBLICATIONS
"Lattice engineered compliant substrate for detect–free heteroeptiaxial growth," F.E. Ejeckam, Y.H. Lo, S. Subramanian, H.Q. Hou and B.E. Hammons, Appl. Phys. Lett. 70(13), Mar. 31, 1997, pp. 1685–1687.*

"Dynamic model for pseudomorphic structures grwon on compliant substrates: An approach to extend the critical thickness," D. Teng and Y.H. Lo, Appl. Phys. Lett. 62 (1), Jan. 4, 1993, pp. 43–45.*

"Dislocation–free InSb grown on GaAs compliant universal substrates," F.E. Ejeckham, M.L. Seaford, Y.H. Lo, H.Q. Hou, and B.E. Hammons, Appl. Phys. Lett. 71 (6), Aug. 11, 1997, pp. 776–778.*

"X–ray interference effect as a tool for the structural investigation of GaInAs/InP multiple quantum wells," T. Marschner, J. Brubach, C.A. Verschuren, M.R> Leys, and J.H. Wolter, J. of Appl. Phys. 83 (7), Apr. 1, 1998, pp. 3630–3637.*

"Growth of InGaAs multi–quantum wells at 1.3 um wavelength on GaAs compliant substrates," Z.H. Zhu, R. Zhou, F.E. Ejeckham, Z. Zhang, J. Zhang, J. Greenberg, and Y.H. Lo, Appl. Phys. Lett. 72 (20) May 18, 1998, pp. 2598–2600.*

* cited by examiner

Primary Examiner—Deborah Jones
Assistant Examiner—Gwendolyn Blackwell Rudasill
(74) Attorney, Agent, or Firm—N. Stephan Kinsella

(57) ABSTRACT

A compliant substrate for the formation of semiconductor devices includes a crystalline base layer and a thin-film crystalline layer on and loosely bonded to the base layers. The thin-film layer has a high degree of lattice flexibility. A compliant substrate for formation of semiconductor devices may also include a crystalline base layer, and, on the base layer, a thin film layer having a lattice constant different from the lattice constant of the base layer. A method for formation of a compliant substrate for formation of semiconductor devices includes forming a thin film layer on a first substrate, bonding a first surface of the thin film layer to a surface of a second substrate having a lattice constant different from the lattice constant of the thin film layer either with or without twist bonding, and removing the first substrate to expose a second surface of the thin film layer.

59 Claims, 7 Drawing Sheets

COMPLIANT UNIVERSAL SUBSTRATES FOR OPTOELECTRONIC AND ELECTRONIC DEVICES

RELATED APPLICATIONS

This application claims priority from U.S. Provisional Patent Application No. 60/110,009, filed Nov. 25, 1998, which is hereby incorporated by reference herein.

FIELD OF THE INVENTION

This invention relates to semiconductor device fabrication methods, and in particular to the formation of optoelectronic and electronic semiconductor devices.

BACKGROUND OF THE INVENTION

It is very difficult to grow high quality thin film materials on conventional prior art substrates with a large lattice mismatch. Such substrates include but are not limited to Si, GaAs, InP, GaP, GaSb, InAs, and sapphire. In the prior art, either a thick buffer layer has to be grown on the substrate, as shown in U.S. Pat. No. 5,285,086, or a special technique, such as the lateral growth method, as disclosed by Parillaud and et al., Appl. Phys. Lett. 68, 2654, 1996, was employed before the growth of the device structure layers. It is known that defects, in particular threaded dislocations, induced by the lattice mismatch can be reduced from $10^{11}$ per square centimeter to $10^5$ per square centimeter by using the lateral growth method. It is difficult to grow reliable epitaxial layers that can be used to fabricate optoelectronic or other electronic devices, due to the high density of the threaded dislocation defects. Prior art substrates exhibit either lattice mismatch or optical absorption that render them unsuitable for use in the growth of optoelectronic or electronic devices.

One such prior art substrate is GaSB. This material is the only material that has served in the prior art as the substrate for type II Sb-based optoelectronic devices, is GaSb. However, commercially available GaSb substrates either have high defect density, greater than $10^4$ per square centimeter, or poor quality in surface smoothness. In contrast, GaAs substrates are characterized by relatively high surface smoothness. The typical FWHM value of a low defect density GaAs substrate is less than 20 arc seconds compared to greater than 100 arc seconds for GaSb substrates. Indeed, GaSb substrates from some vendors have surface roughness that can be observed using optical microscopes with low magnification.

A further disadvantage of using prior art GaSb substrates in optoelectronic devices is the strong absorption of GaSb at wavelengths shorter than 1530 nm. Referring to FIG. 1, there is shown a prior art technique with a sub-mount 112, bonding material 115 on submount 112, GaSb substrate 120 on bonding material 115, and epitaxial layer 125 on substrate 120. Due to the strong absorption of GaSb, a fabricated laser bar has to be attached to the sub-mount using this configuration, known as an epi-up configuration. In the epi-up configuration, heat removal from the active region, i.e., epitaxial layer 125, requires conduction of heat through the GaSb substrate, which has poor thermal conductivity. Even when the substrate has been thinned down to 70 nm, heat removal from the laser active region and across the GaSb substrate is still not efficient. This poor efficiency in removing heat from the active region causes the active region to heat up. Higher temperatures in the active region will increase internal loss and threshold pump power density and reduce the laser output power.

Since, as noted above, high quality GaAs substrate, characterized by a low occurrence of defects, is commercially available and as GaAs does not absorb strongly around the 980 nm wavelength, it would be highly desirable to grow Sb-base type-II optically pumped laser devices on a GaAs substrate. However, the lattice mismatch between AlSb or GaSb, and GaAs is 7.8%. A lattice mismatch such as this between the substrate and the epitaxial thin film is sufficiently great as to induce high defect density, greater than $10^{11}$ cm$^{-2}$, in the epitaxial thin film. It is difficult to fabricate reliable and high power mid-infrared (IR) lasers, or any other electronic device, from a high defect-density epitaxial layer.

A high quality compliant universal (CU) substrate is needed to grow antimony based, nitrogen-based, and phosphor (P)-based optoelectronic or electronic devices. In the prior art, Lo proposed, in U.S. Pat. No. 5,294,808, issued Mar. 15, 1994, to use a thin substrate having a thickness on the same order as the critical thickness (the thickness at which defects form when growing one lattice mismatched material on another). A disadvantage of this approach is that the critical thickness is only few hundred angstroms, and it is difficult to sustain the mechanical and chemical processes required for epitaxial growth and device fabrication on a substrate having a thickness of only a few hundred angstroms.

A CU substrate fabricated by twist bonding AlGaAs/GaAs to GaAs has been demonstrated (Z. H. Zhu et al., IEEE J. Selected Topics in Quantum Electronics 3, 927, 1997) to be a candidate for a suitable CU substrate. However, it is very difficult to etch GaAs substrate away from AlGaAs thin film with a good yield. Jet etching has been used as the tool to etch away GaAs in a reasonable time frame. The liquid acid jet pressure applied on the substrate surface enhances the GaAs etch rate but also causes damage in the thin compliant substrate. It is thus more labor intensive and more difficult to manufacture a substrate of this type because it is necessary during the jet etching process to monitor continuously for possible damage to the thin CU substrate.

OBJECTS OF THE INVENTION

To address the problem of lattice mismatch between Sb-base thin films used in Mid-IR (MIR) optoelectronic devices and any other III-V heteroepitaxy layer, a CU substrate is needed that can grow high quality epitaxial thin film with lattice mismatch up to 20%. This new CU substrate should be able to grow any high quality III-V thin film and also sustain both sample preparation before and during epitaxial growth and device fabrication after epitaxial growth using molecular beam epitaxy (MBE) or MOCVD.

Additional objects and advantages of the invention will become evident from the detailed description of a preferred embodiment which follows.

SUMMARY OF THE INVENTION

According to the present invention, a compliant substrate has a base layer and a thin-film layer thereon and loosely bonded thereto. The thin-film layer has a high degree of lattice flexibility.

According to another aspect of the present invention, a compliant substrate has a base layer and a thin-film layer thereon. The base layer and the thin-film layer have different lattice constants, and are bonded together with or without twisting bonding.

BRIEF DESCRIPTION OF THE DRAWINGS

The features and advantages of the present invention will become apparent from the following detailed description of a number of preferred embodiments thereof, taken in conjunction with the accompanying drawings, in which.

DETAILED DESCRIPTION OF EMBODIMENTS OF THE PRESENT INVENTION

Figure 2:
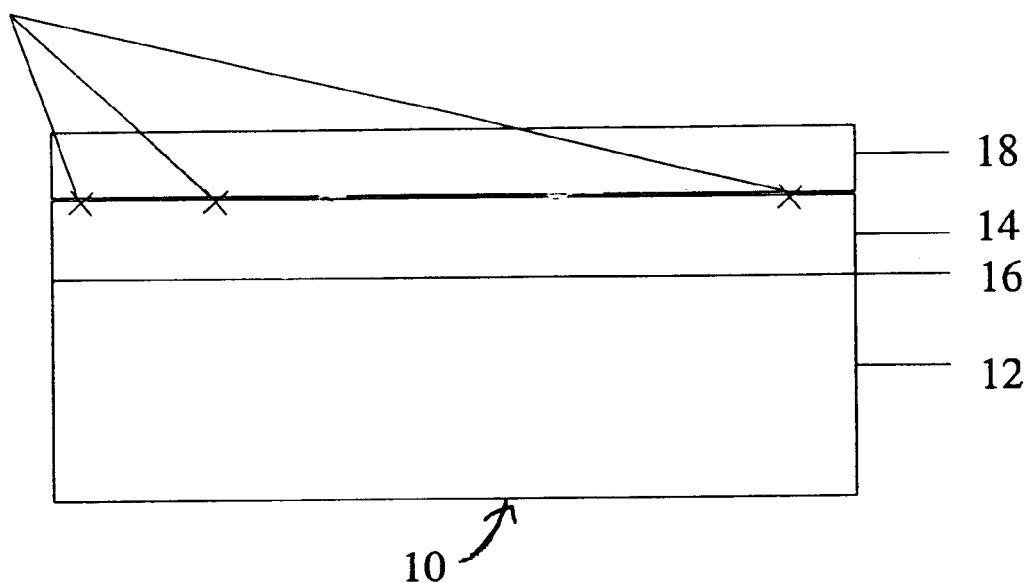
FIG. 2 is a schematic diagram illustrating a generic layered structure employed in the present invention to form defect-free epitaxial layers on compliant thin substrates.

Turning now to a detailed consideration of embodiments of the present invention, FIG. 2 illustrates a CU substrate 10, which may be constructed in accordance with any of the preferred materials and techniques set forth below. The CU substrate 10 is a multiple layer structure having a thick bulk material base layer 12 and a compliant thin film substrate layer 14 which is bonded to the bulk material base layer 12 at a bonding interface 16. The compliant thin film substrate layer 14 serves as the actual substrate that supports an epitaxial layer or epilayer 18 grown thereon. Thin film substrate layer 14 preferably has a thickness on the order of 20 nm or less. Thin film substrate layer 14 is mechanically robust because it is bonded to the base layer 12. It should be noted that the bonding interface 16 may actually comprise a thin interfacial layer which may vanish, or be as thin as one atomic layer or as thick as a few hundred angstroms.

The bulk material base layer 12 may be any suitable substrate material, such as commercially available high quality substrate material, such as Si, GaAs, InP, or GaP. The thin film substrate layer 14 can be made from either the same or a different material than that employed in the base layer 12.

Theoretical analysis has been conducted which shows that when the thin film substrate layer 14 is loosely bonded to the supporting bulk material base layer 12, the substrate layer 14 becomes more compliant. The phrase loosely bonded means that the bonding energy in the interface between the atoms in the base layer 12 and the atoms in the substrate layer 14 is lower than the bonding energy of the atoms in either the base layer 12 or the substrate layer 14 themselves. It should be noted that the fact that the thin film substrate layer 14 is loosely bonded to the base layer 12 does not mean that the thin film substrate layer 14 could be easily separated from the base layer 12. The strength of the bond between thin film substrate layer 14 and the base layer 12 can be as strong as the internal bonding force in the base layer 12. Through the lattice engineering employed in the present invention, the lattice of the bonded thin film substrate 14 can be made highly flexible without weakening the mechanical strength of the resulting CU substrate.

In a CU substrate, it is desirable to fabricate a structure in which all of the defects are contained in the thin substrate layer 14. This substrate may be referred to as a compliant substrate. Epitaxial layers without defects can be achieved at the expense of the substrate which collect all the dislocations. Other mechanisms, such as creating slips, microcracks and other types of plastic deformation in the thin substrate layer also contribute to the compliance function of the substrate.

In forming a CU substrate it is desirable to create a thin template with a highly flexible lattice structure to accommodate epitaxial films of different lattice constants. Here it should be stressed that the lattice flexibility is not through a change of the lattice constant uniformly across the template. Instead, the lattice flexibility refers to local change of lattice structure at an atomic scale through lattice engineering techniques. In a CU substrate for epitaxial growth, the thin film substrate or compliant substrate is preferably loosely bonded to the material underneath, and the compliant substrate is preferably very thin. In all preferred embodiments of the present invention, the crystal structure of the substrate material itself is employed to define the structure size, and the microstructure of twist boundaries or lattice mismatch boundaries are used to achieve the desirable lattice compliance properties. Using this scheme, the substrate surface appears to be the same as a standard substrate except that, microscopically, atoms on and near the surface become much more flexible. As a result, those atoms are much more compliant to the material grown thereon.

Figure 3A:
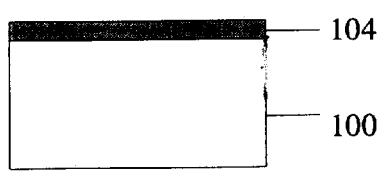
FIGS. 3A, B, C, D, and E are schematic illustrations of the process employed to fabricate a CU substrate in accordance with the present invention.
Figure 3D:
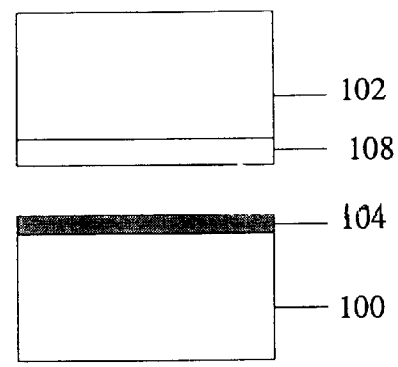
Figure 3B:
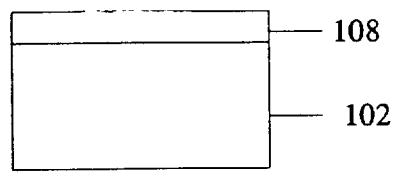

Referring now to FIGS. 3A–E, a method according to the present invention will be explained. As illustrated in FIGS. 3A and 3B, first and second wafers 100 and 102 are provided, each of which is formed from a suitable bulk substrate material. Examples of suitable bulk substrate materials are Si, GaAs, InP, GaSb, GaP, and InAs. It should be emphasized that any suitable material may be employed as the bulk substrate material, including both semiconductor and non-semiconductor materials. First wafer 100 may undergo a surface treatment process to form a treated top surface 104, as shown in FIG. 3A. The surface treatment process may be, for example, a dip of the substrate in an HF solution to provide a hydrophobic surface. In one aspect of the invention, shown in FIG. 3C, an etch stop layer 106 is then formed on second wafer 102. Etch stop layer 106 may be any suitable material usable as an etch stop layer, such as AlGaAs, InGaP and InAlP. A thin film layer 108 is formed on etch stop layer 106 using any suitable conventional technique. Alternatively, thin film layer 108 is formed directly on the second wafer 102, as shown in FIG. 3B.

Figure 3C:
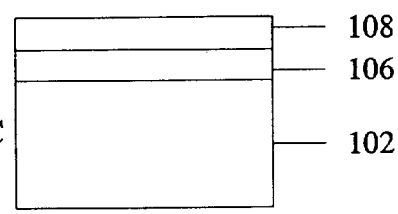
Figure 3E:
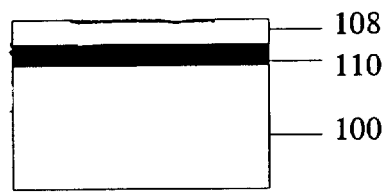

Next, as illustrated in FIG. 3D, the second wafer 102 is inverted relative to the first wafer 100, and the thin film layer 108 is bonded to the top surface 104 of the first wafer 100. The joining of the two wafers 100 and 102 can be through Van Der Waals force, hydrogen bond, covalent bond, ionic bond or any other mechanism, and results in formation of a bonding interface 110, shown in FIG. 3E. Bonding interface 110 may, but need not, include a finite thickness interfacial layer. Pressure may be applied during the step of wafer bonding. Depending on the detailed process conditions and the bonding mechanisms, the applied pressure can vary from zero to 10 MPascal or higher. Finally, as illustrated in FIG. 3E, the second wafer 102 is removed by a selective etching technique. Etch stop layer 106 may be used to prevent removal of thin film layer 108. The exposed thin film layer 108 can be used as a compliant substrate platform for epitaxial growth, while the first wafer 100 now becomes the supporting bulk material base layer.

The three examples below illustrate particular materials that may be employed in the method described above with reference to FIGS. 3A–3E.

1) GaInAs/InP

Thin film 108 is an InGaAs thin film with an In content between 30% to 75%. Its thickness is from 3 nm to 30 nm. Second wafer or second substrate 102 is of InP. Since the lattice constant of GaInAs is similar to that of InP, no defects are formed in the epitaxial growth of thin film layer 108. This thin film 108 is either directly bonded or twist bonded to substrate 100, which may be of GaAs, InP, Si, sapphire, SiC, Ge, GaP, InAs, or GaSb.

2) InP/GaInAs/InP

Substrate 102 is of InP. Referring to FIG. 3C, a GaInAs buffer layer 106, having a thickness of more than 400 angstroms is grown on the substrate 102 before the growth of the InP thin film 108. Since GaInAs has similar lattice constants to InP, no defects are formed in the grown epitaxial InP layer 108. Thin film layer 108 can be either directly bonded or twist bonded to substrate 100, which may be any of GaAs, Ge, GaP, InP, Si, SiC, InAs, sapphire, and GaSb.

3) GaSb/InAs or InAs/GaSb

Substrate 102 is of InAs or GaSb. Thin-film layer 108 is of the other one of InAs and GaSb, and has a thickness between 3 nm and 30 nm. As the lattice mismatch between InAs and GaSb is less than 0.7%, the GaSb or InAs thin film is not relaxed and no defects should be formed in epitaxial thin film layer 108. Thin film layer 108 can either be direct bonded or twist bonded to substrate 100, which may be any of GaAs, InP, Si, Ge, SiC, sapphire, InAs, GaSb, and GaP.

These are just a few examples of materials for use in the fabrication of CU substrates in accordance with the present invention. There are many other ways to achieve CU substrate with different III-V materials; however the principle is the same as the above examples.

The use of twist bonding, as discussed below, increases lattice flexibility of the thin film substrate layer 108 and therefore helps in assuring that thin film layer 108 is compliant enough to permit growth of defect free lattice mismatched epitaxial layers thereon.

Formation and Microstructures of Twist and Direct Bounding

Figure 4:
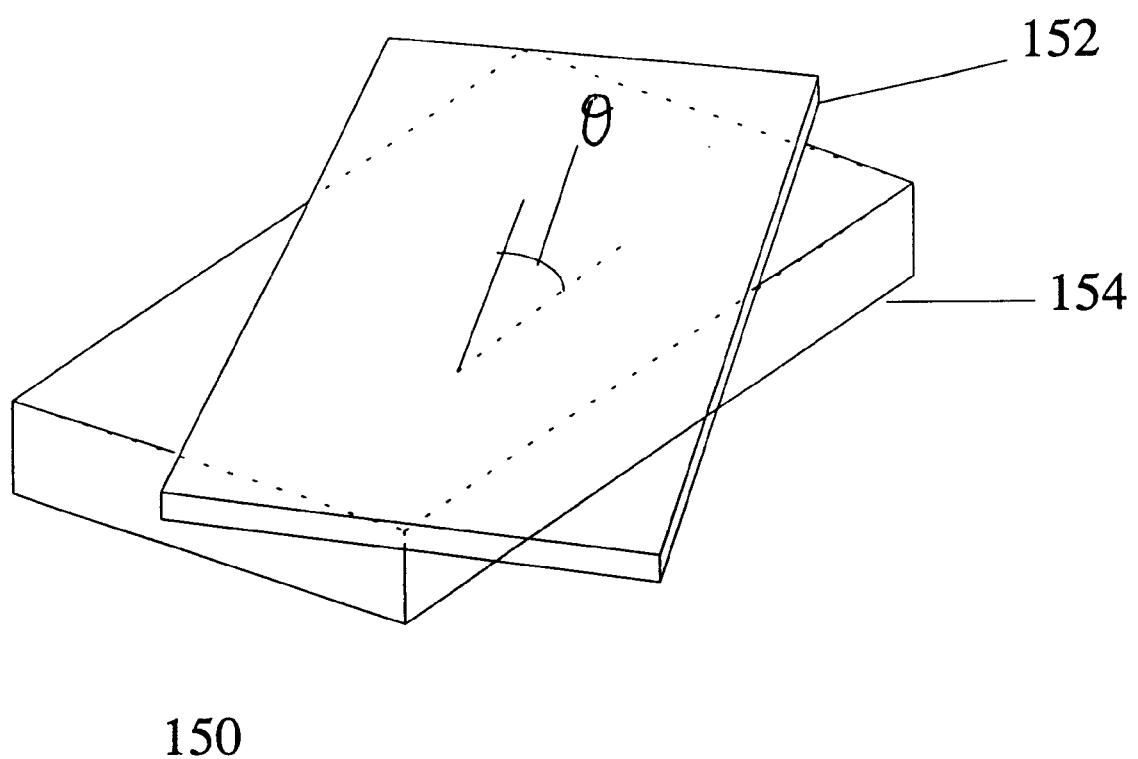
FIG. 4 is a schematic illustration of a CU substrate constructed in accordance with the present invention.

With reference to FIG. 4, a CU substrate 150 is illustrated comprising a thin film substrate layer 152 and a supporting bulk material base layer 154. Bulk material base layer 154 may be of any suitable material, such as commercially-available wafers. Examples of different combinations of materials which can be employed for the substrate layer 152/base layer 154 include, but are not limited to, the following: GaInAs/GaAs, GaInAs/Si, GaInAs/GaP, GaAs/GaP, InP/GaAs, InP/Si, and GaSb/Si. The most important feature is that the two materials forming the substrate and base layers have different lattice constants. With different lattice constants in the base layer and the thin film layer, the layers can be bonded together either by a direct bond, which would be illustrated by FIG. 4 with an angle $\theta$ of zero degrees, or by a twist bond, which would be illustrated by FIG. 4 with an angle>0, to form a CU substrate.

A bonded thin film layer behaves as a CU substrate. It is believed that this behavior is for the following reasons. When the top and bottom atoms are largely misaligned or have different lattice constants, some atoms become rather flexible in the surface normal direction. On the other hand, in the area enclosed by screw dislocations, atoms are well aligned as in a bulk crystal so there is no such flexibility. Hence, these atomically aligned regions function as anchored regions. In the case of a twist bond, the spacing between screw dislocations is reduced when the angle increases. This will reduce the isolated-anchored regions, which will vanish at a sufficiently large angle. At such an angle, a nearly ideal compliant substrate for the growth of a large lattice mismatch epitaxial layer is created, as almost all atoms will exhibit flexibility. The direct bonding of materials with two different lattice constants does not have the same flexibility as twist bonding. However, direct bonding is still useful for the growth of small lattice mismatch epitaxial layers.

Figure 5:
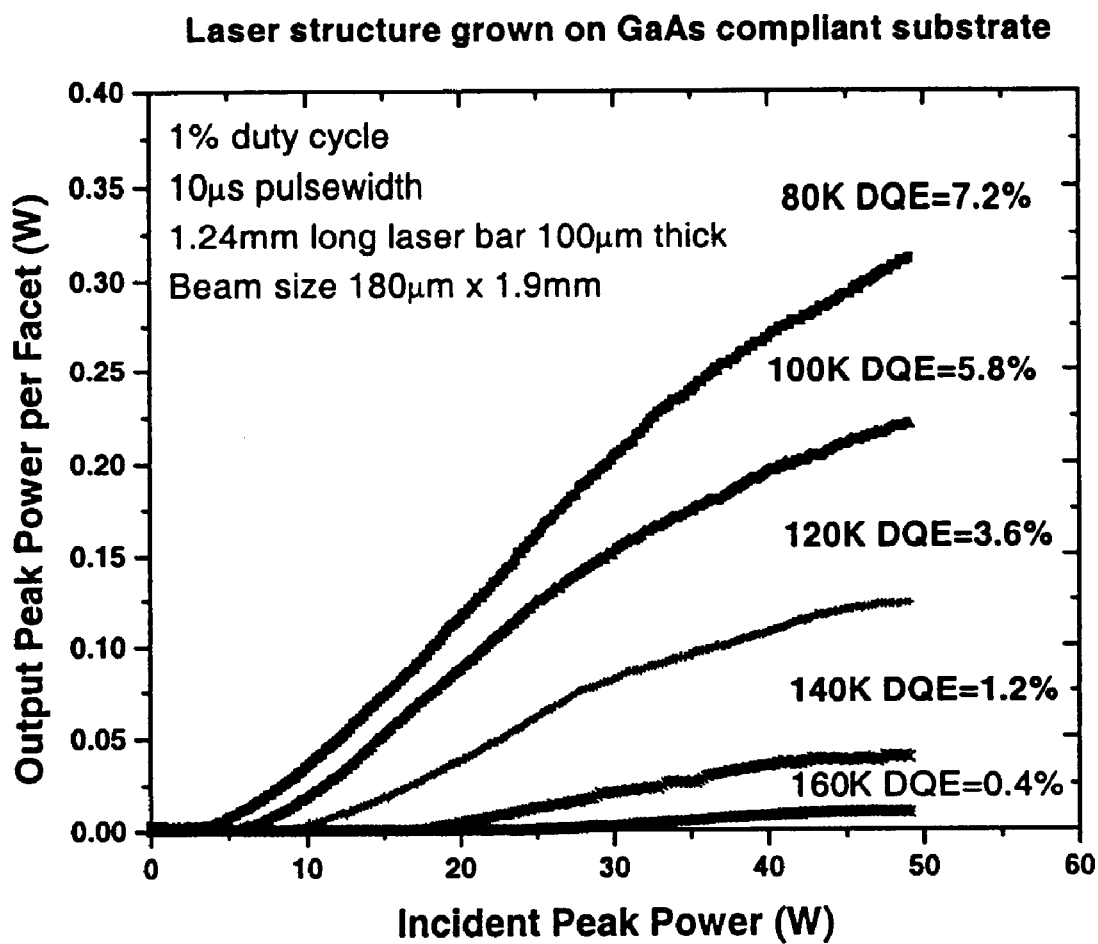
FIG. 5 is an output power measurement of an optically pumped type-II QW laser grown on a GaAs compliant substrate.
Figure 6:
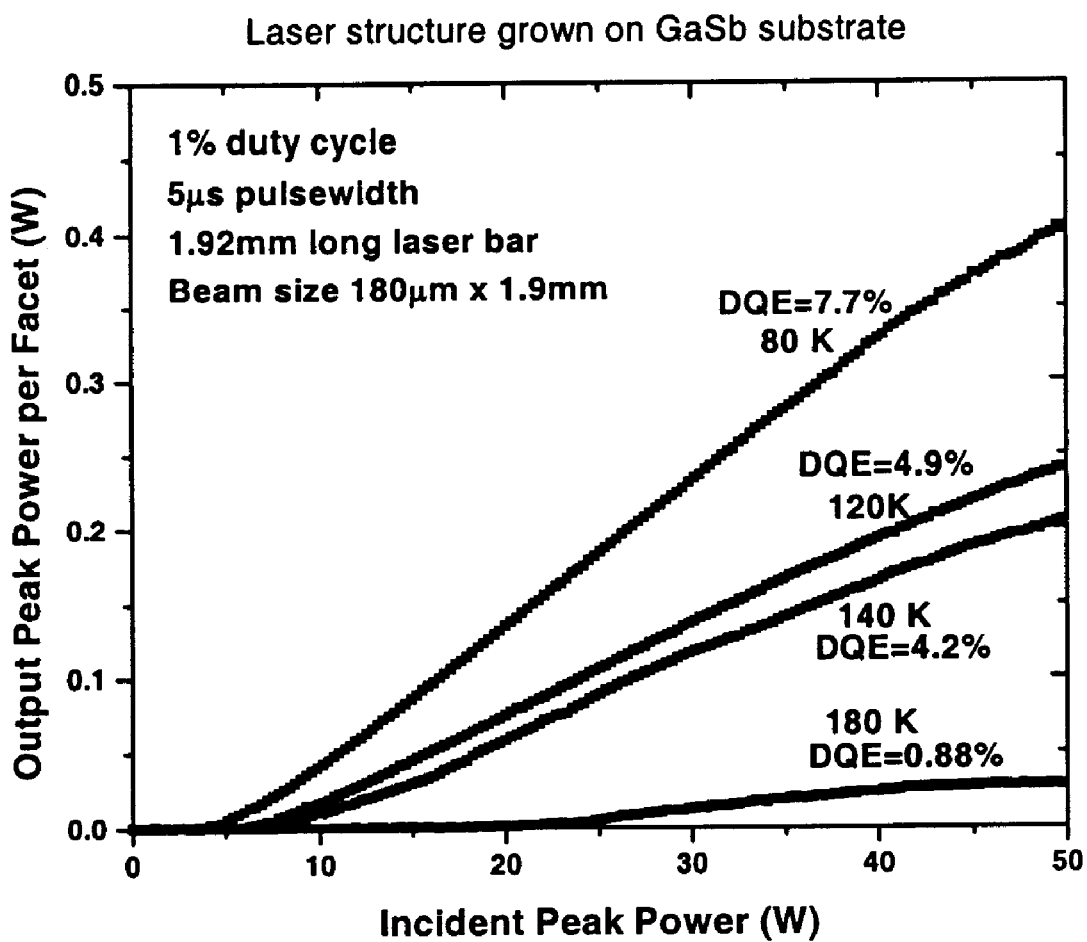
FIG. 6 is an output power measurement of optically pumped type-II QW laser grown on a GaSb substrate.

Growth of High-power Mid-IR type III Quantum-well Lasers on Compliant Substrates Optically pumped type-II QW lasers have been grown on a direct bond (illustrated by FIG. 4 with an angle equal to 0) GaInAs/GaAs compliant substrate. The incident power vs. output power at various temperatures for laser structures grown on the CU substrate is shown in FIG. 5. For comparison, the same laser structure has been grown on a GaSb substrate and the incident power vs. output power at various temperatures is shown in FIG. 6. It is clear from the 80 K data that the laser grown on the GaSb substrate has a differential quantum efficiency (DQE) of 7.7% compared to 7.2% for the laser grown on the compliant substrate. The threshold pump power density is about 1000 W/CM2 for both samples at 80 K as can be seen from FIGS. 5 and 6. Since the threshold pump power density at low temperature is determined by the defect related non-radiative recombination, the quality of the material grown on the compliant substrate is as good as the quality of the material grown on GaSb substrate. This device has been tested under high-power conditions for many days with no observed degradation of performance. This test proves the reliability of the laser grown on the compliant substrate.

The present invention provides CU substrates that may be formed from conventional semiconductor and other bulk material, which facilitates growth of highly lattice mismatched defect-free epitaxial layers. This is accomplished through provision of the thin substrate layer, which is highly flexible due to the decreased bonding energy between base layer 12 and thin film substrate layer 14, as shown in FIG. 2. The present invention thereby facilitates the formation of a wide range of devices, which were previously not feasible to construct due to lattice mismatch constraints. As examples, the following is a list of some potential applications of the CU substrate structures and methods of the present invention:

(1) High Power Mid-Infrared Lasers.

Figure 1:
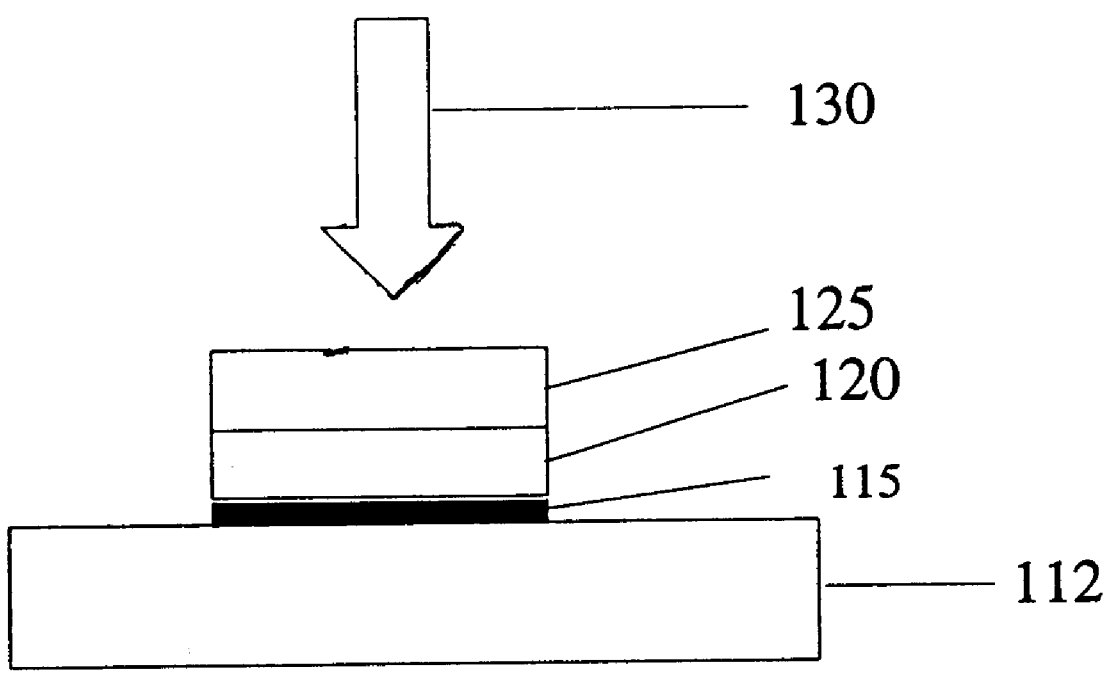
FIG. 1 is a cross-section of a prior art structure for use in optoelectronic devices.
Figure 7:
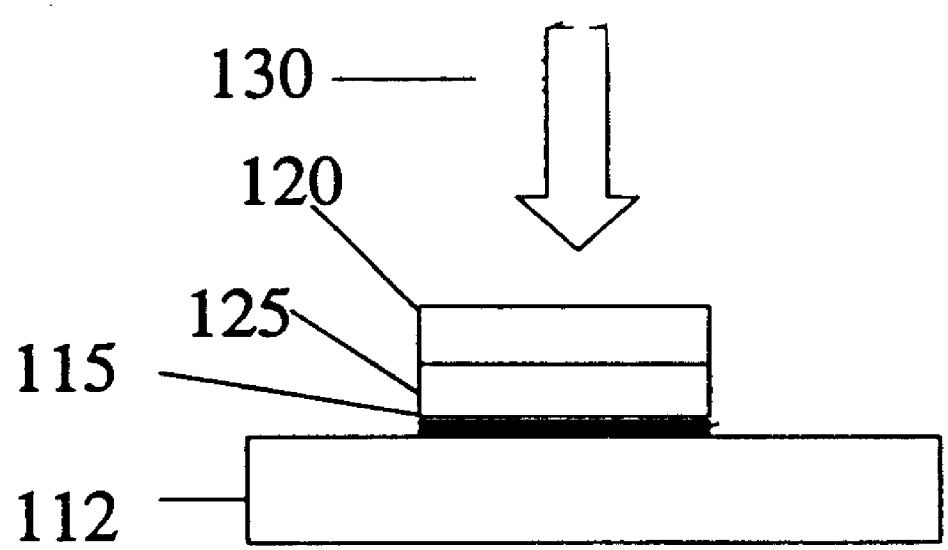
FIG. 7 is a schematic illustration of the epi-down configuration for laser mounting in output power measurement.

Sb-base optically pumped type-IIQW or superlattice (SL) lasers at 2 to 10 $\mu$m can be grown on the GaAs compliant substrates. The laser active region may be made of, by way of example only, either InAs/InGaAlSb/InAs/InAlSb type-II QWs or InAs/InGaAlSb type-III SLs. The advantage of growing lasers on the GaAs compliant substrate is that the laser may be bonded onto the submount with the epi-down configuration as shown in FIG. 7. In FIG. 7, there is provided sub-mount 112, with bonding material 115 thereon, epitaxial layer 125 on bonding material 115, and substrate 120 on epitaxial layer 125. This structure contrasts with the prior art epi-up configuration shown in FIG. 1. By using the epi-down configuration of FIG. 7, the maximum laser output power can be dramatically improved, as there is better heat removal capability from the laser active region, as there is no need to attempt to conduct heat across a GaSb substrate layer.

(2) Mid-Infrared (IR) and IR Photodetectors.

High performance IR photodetectors at 2 to 25 $\mu$m can be composed of, for example, InAlGaAs/InAlGaSb type-II SLs. In the prior art, these materials were grown on GaSb or InAs substrates, to which the photodetector materials can be lattice matched. This prior art structure has the disadvantage that both InAs and GaSb substrates highly absorb radiation at wavelengths longer than 5 μm. Therefore, using such prior art substrates, epi-side down mounting to the read out circuits is very difficult to use. Using the teachings of the invention, IR photodetectors can be grown on large bandgap compliant substrates, and hence photodetectors can be integrated with readout circuits using the epi-down configuration to allow light to pass from the compliant substrate. The compliant substrate can be used as a filter to filter out radiation in the visible and UV spectrum.

(3) Visible and UV Laser diodes.

Red, orange, and yellow/green diode lasers can be achieved through growth of InGaAlP heterostructures on GaAs CU substrates without restriction to available lattice-matched substrates. High-quality InGaN/AlGaN ultraviolet, blue, and green lasers can be grown on compliant substrates; such lasers are characterized by long lifetimes and low defect densities. In the prior art, these devices are grown on sapphire or SiC substrates with a large lattice mismatch. This produces very high defect density and results in lasers with short lifetimes. These lasers can be used, for example, in displays, DVD for optical data storage, medical applications, and chemical sensors to monitor band to band transition for gas species.

(4) High Temperature, High-Power, High Voltage Electronic Devices.

Transistors composed of InGaAlN and SiC heterostructures can sustain high voltage and high temperature, and can deliver high power. These are attractive features for the power industry and the microwave communication industry. The electrical properties of InGaAlN and SiC compounds grown on CU substrates are much superior to those grown on other mismatched substrates in both carrier mobility and breakdown voltage.

(5) High-Efficiency Visible LEDs.

Red, orange, and yellow/green LEDs can be fabricated through the growth of InGaAlP heterostructures on GaAs-based CU substrates. LEDs from red to UV wavelengths can be fabricated with InGaN/InGaAlN heterostructures grown on Si, or other CU substrates. CU substrates are more attractive than the sapphire or SiC substrates used in the prior art from the standpoint of both cost and electrical properties.

(6) Optoelectronic integrated circuits and electronic circuits with mixed material.

III-V compound lasers can be integrated to Si circuits more easily using CU substrates than in prior art integration techniques like flip chip bonding and epitaxial lift off. It is also possible, using CU substrates, to work on the whole wafer; in prior art flip chip bonding and epitaxial lift off techniques, only a fraction of the wafer could be worked on at one time.

It will be understood that while the invention has been explained with reference to preferred embodiments, the invention is not limited to those embodiments, and variations may be made by those of skill in the art without departure from the spirit and scope of the invention.

What is claimed is:

1. A substrate comprising:
   a base layer;
   a bonding interface; and
   a thin film layer, the thin film layer disposed on the bonding interface, the bonding interface disposed on the base layer, and the thin film layer formed as a compliant substrate platform, wherein the base layer, bonding interface, and thin film layer form a compliant substrate that supports a photodetector integrated with readout circuits using an epi-down configuration to allow light to pass from the compliant substrate.

2. The substrate of claimed 1, wherein the thin film layer comprises $In_xGa_{1-x}As$, wherein x is approximately 10% to approximately 70%.

3. The substrate of claim 1, wherein the thin film layer comprises $In_xGa_{1-x}As$, wherein x is approximately 30% to approximately 75%.

4. The substrate of claim 1, wherein the thin film layer comprises approximately 3 nanometers to approximately 30 nanometers in thickness.

5. The substrate of claim 1, wherein the thin film layer comprises either a directly bonded layer or a twist bonded layer to the base layer.

6. The substrate of claim 1, wherein the base layer comprises one of GaAs, InP, Si, sapphire, SiC, Ge, GaP, InAs, and GaSb.

7. The substrate of claim 1, wherein the thin film layer provides the platform for growth of epitaxial layers.

8. The substrate of claim 1, wherein the thin film layer facilitates growth of lattice-mismatched, defect-free epitaxial layers.

9. The substrate of claim 8, wherein the lattice-mismatched, defect-free epitaxial layers are provided by decreased bonding energy between the base layer and the thin film layer.

10. The substrate of claim 1, wherein the thin film layer comprises a platform for growth of an infrared detector operating at approximately 2–25 micrometers comprising InAlGaAs/InAlGaSb type II superlattices.

11. The substrate of claim 1, wherein the thin film layer is formed as a compliant substrate platform without using an etch stop layer.

12. The substrate of claim 1, wherein the base layer, bonding interface, and thin film layer form a compliant substrate, and wherein the compliant substrate acts as a filter for visible and ultraviolet radiation.

13. The substrate of claim 1, wherein the thin film layer comprises a thickness of less than or equal to approximately 20 nanometers.

14. The substrate of claim 1, wherein a bonding energy at the bonding interface between the base layer and the thin film layer is less than bonding energies of atoms in the base layer and in the thin film layer.

15. The substrate of claim 1, wherein the base layer and the thin film layer comprise the same material.

16. The substrate of claim 1, wherein the base layer and the thin film layer comprise different materials.

17. The substrate of claim 1, wherein the thin film layer comprises a sacrificial layer having a lattice flexibility sufficient to collect threaded dislocation defects caused by lattice mismatch when growing an epitaxial layer on the thin film layer, and wherein the thin film layer permits growth of defect-free lattice mismatched epitaxial layers thereon.

18. The substrate of claim 1, wherein the bonding interface comprises a thickness no less than one atomic layer and no greater than a few hundred angstroms.

19. A compliant substrate for formation of semiconductor devices, comprising:
   a crystalline base layer;
   a bonding interface; and
   a thin film layer, the thin film layer having a high degree of lattice flexibility, the thin film layer disposed on the bonding interface, the bonding interface disposed on the base layer, and the thin film layer formed as a compliant substrate platform, wherein the base layer, bonding interface, and thin film layer form a compliant substrate that supports a photodetector integrated with readout circuits using an epi-down configuration to allow light to pass from the compliant substrate.

20. The compliant substrate of claim 19, wherein the base layer comprises GaAs, and the thin film layer comprises GaInAs.

21. The compliant substrate of claim 19, wherein the thin film layer comprises a sacrificial layer having a lattice flexibility sufficient to collect threaded dislocation defects caused by lattice mismatch when growing an epitaxial layer on the thin film layer, and wherein the thin film layer permits growth of defect-free lattice mismatched epitaxial layers thereon.

22. A compliant substrate for formation of semiconductor devices, comprising:
a crystalline base layer having a first lattice constant;
a bonding interface; and
a thin film layer having a second lattice constant, the thin film layer disposed on the bonding interface, the bonding interface disposed on the base layer, and the thin film layer formed as a compliant substrate platform, wherein the base layer, bonding interface, and thin film layer form a compliant substrate that supports a photodetector integrated with readout circuits using an epi-down configuration to allow light to pass from the compliant substrate.

23. A substrate comprising:
a base layer;
a bonding interface; and
a thin film layer, the thin film layer disposed on the bonding interface, the bonding interface disposed on the base layer, and the thin film layer formed as a compliant substrate platform, wherein a laser is grown on the substrate and the laser in bonded to a submount with an epi-down configuration.

24. The substrate of claim 23, wherein the thin film layer is formed as a compliant substrate platform without using an etch stop layer.

25. The substrate of claim 23, wherein the thin film layer comprises $In_xGa_{1-x}As$, wherein x is approximately 10% to approximately 70%.

26. The substrate of claim 23, wherein the base layer, bonding interface, and thin film layer comprise a substrate for formation of a type II quantum well laser.

27. The substrate of claim 23, wherein the base layer, bonding interface, and thin film layer comprise a substrate for formation of a superlattice laser.

28. The substrate of claim 23, wherein the thin film layer comprises $In_xGa_{1-x}As$, wherein x is approximately 30% to approximately 75%.

29. The substrate of claim 23, wherein the thin film layer comprises approximately 3 nanometers to approximately 30 nanometers in thickness.

30. The substrate of claim 23, wherein the thin film layer comprises either a directly bonded layer or a twist bonded layer to the base layer.

31. The substrate of claim 23, wherein the base layer comprises one of GaAs, InP, Si, sapphire, SiC, Ge, GaP, InAs, and GaSb.

32. The substrate of claim 23, wherein the thin film layer provides the platform for growth of epitaxial layers.

33. The substrate of claim 23, wherein a laser is grown on the thin film layer comprising a laser active region comprising InAs/InGaAlSb/InAs/InAlSb type II quantum wells or InAs/InGaAlSb type III superlattices.

34. The substrate of claim 23, wherein the thin film layer facilitates growth of lattice-mismatched, defect-free epitaxial layers.

35. The substrate of claim 34, wherein the lattice-mismatched, defect-free epitaxial layers are provided by decreased bonding energy between the base layer and the thin film layer.

36. The substrate of claim 23, wherein the base layer, bonding interface, and thin film layer comprise a compliant GaAs substrate for growth of an Sb-based type II quantum well or superlattice laser operating at approximately 2–10 micrometers wavelength.

37. The substrate of claim 23, wherein the base layer, bonding interface, and thin film layer comprise a compliant substrate for growth of a laser active region comprising InAs/InGaAsAlSb/InAs/InAlSb type II quantum wells or InAs/InGaAlSb type III superlattices.

38. The substrate of claim 23, wherein the base layer, bonding interface, and thin film layer form a compliant substrate, and wherein the compliant substrate acts as a filter for visible and ultraviolet radiation.

39. The substrate of claim 23, wherein the base layer, bonding interface, and thin film layer comprise a GaAs compliant substrate for that supports a red, orange, or yellow/green diode laser using InGaAlP.

40. The substrate of claim 23, wherein the base layer, bonding interface, and thin film layer comprise a compliant substrate that supports an InGaN/AlGaN ultraviolet, blue, or green laser.

41. The substrate of claim 23, wherein the base layer, bonding interface, and thin film layer comprise a compliant substrate for growing III-V compound lasers integrated on Si circuits.

42. The substrate of claim 23, wherein the thin film layer comprises a thickness of less than or equal to approximately 20 nanometers.

43. The substrate of claim 23, wherein a bonding energy at the bonding interface between the base layer and the thin film layer is less than bonding energies of atoms in the base layer and in the thin film layer.

44. The substrate of claim 23, wherein the base layer and the thin film layer comprise the same material.

45. The substrate of claim 23, wherein the base layer and the thin film layer comprise different materials.

46. The substrate of claim 23, wherein the thin film layer comprises a sacrificial layer having a lattice flexibility sufficient to collect threaded dislocation defects caused by lattice mismatch when growing an epitaxial layer on the thin film layer, and wherein the thin film layer permits growth of defect-free lattice mismatched epitaxial layers thereon.

47. The substrate of claim 23, wherein the bonding interface comprises a thickness no less than one atomic layer and no greater than a few hundred angstroms.

48. A compliant substrate for formation of semiconductor devices, comprising:
a crystalline base layer;
a bonding interface; and
a thin film layer, the thin film layer having a high degree of lattice flexibility, the thin film layer disposed on the bonding interface, the bonding interface disposed on the base layer, and the thin film layer formed as a compliant substrate platform, wherein a laser is grown on the substrate and the laser in bonded to a submount with an epi-down configuration.

49. The compliant substrate of claim 48, wherein the base layer comprises GaAs, and the thin film layer comprises GaInAs.

50. The compliant substrate of claim 48, wherein the thin film layer comprises a sacrificial layer having a lattice flexibility sufficient to collect threaded dislocation defects caused by lattice mismatch when growing an epitaxial layer on the thin film layer, and wherein the thin film layer permits growth of defect-free lattice mismatched epitaxial layers thereon.

51. The compliant substrate of claim 48, wherein the thin film layer is formed as a compliant substrate platform without using an etch stop layer.

52. The compliant substrate of claim 22, wherein the base layer comprises GaAs, and the thin film layer comprises GaInAs.

53. The compliant substrate of claim 22, wherein the thin film layer comprises a sacrificial layer having a lattice flexibility sufficient to collect threaded dislocation defects caused by lattice mismatch when growing an epitaxial layer on the thin film layer, and wherein the thin film layer permits growth of defect-free lattice mismatched epitaxial layers thereon.

54. The compliant substrate of claim 22, wherein the thin film layer is formed as a compliant substrate platform without using an etch stop layer.

55. A compliant substrate for formation of semiconductor devices, comprising:

a crystalline base layer having a first lattice constant;

a bonding interface; and a thin film layer having a second lattice constant, the thin film layer disposed on the bonding interface, the bonding interface disposed on the base layer, and the thin film layer formed as a compliant substrate platform, wherein a laser is grown on the substrate and the laser in bonded to a submount with an epi-down configuration.

56. The compliant substrate of claim 55, wherein the base layer comprises GaAs, and the thin film layer comprises GaInAs.

57. The compliant substrate of claim 55, wherein the thin film layer comprises a sacrificial layer having a lattice flexibility sufficient to collect threaded dislocation defects caused by lattice mismatch when growing an epitaxial layer on the thin film layer, and wherein the thin film layer permits growth of defect-free lattice mismatched epitaxial layers thereon.

58. The compliant substrate of claim 55, wherein the thin film layer is formed as a compliant substrate platform without using an etch stop layer.

59. The compliant substrate of claim 19, wherein the thin film layer is formed as a compliant substrate platform without using an etch stop layer.

* * * * *